United States Patent
Kirkman (10) Patent No.: US 10,892,316 B2
(45) Date of Patent: Jan. 12, 2021

(54) HIGH DENSITY BALL GRID ARRAY (BGA) PACKAGE CAPACITOR DESIGN

(71) Applicant: Google LLC, Mountain View, CA (US)

(72) Inventor: Scott Kirkman, Menlo Park, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/370,073

(22) Filed: Mar. 29, 2019

(65) Prior Publication Data

US 2020/0161413 A1     May 21, 2020

Related U.S. Application Data

(60) Provisional application No. 62/767,922, filed on Nov. 15, 2018.

(51) Int. Cl.
*H01L 23/64* (2006.01)
*H01L 23/528* (2006.01)
(Continued)

(52) U.S. Cl.
CPC .............. *H01L 28/40* (2013.01); *H01L 23/48* (2013.01); *H01L 23/488* (2013.01);
(Continued)

(58) Field of Classification Search
CPC ..... H01L 23/48; H01L 23/488; H01L 23/498; H01L 23/528; H01L 23/5286; H01L 23/538; H01L 23/5386; H01L 23/58; H01L 23/642; H01L 24/10; H01L 24/12; H01L 24/14; H01L 24/15; H01L 24/17; H01L 24/18; H01L 24/20; H01L 24/23;
(Continued)

(56) References Cited

U.S. PATENT DOCUMENTS 6,423,577 B1   7/2002  Cheng et al.
7,378,733 B1   5/2008  Hoang et al.
(Continued)

OTHER PUBLICATIONS

Akiyama, T., et al. "An ultrawide-band (120 nm) semiconductor optical amplifier having an extremely-high penalty-free output power of 23 dBm realized with quantum-dot active layers" In Optical Fiber Communication Conference, p. PD12, Optical Society of America, Feb. 22, 2004.
(Continued)

*Primary Examiner* — Eduardo A Rodela
(74) *Attorney, Agent, or Firm* — Lerner, David, Littenberg, Krumholz & Mentlik, LLP (57) ABSTRACT

A circuit package is provided that includes a substrate having a first side and a second side, an integrated circuit component coupled to the second side of the substrate, and a ball grid array formed on the first side of the substrate, the ball grid array including multiple contact balls arranged in a pattern. Each of a first subset of the contact balls is electrically coupled to a first voltage input of an integrated circuit component, and each of a second subset of the contact balls is electrically coupled to a second voltage input of the integrated circuit component. The package also includes a capacitor mounted to the first side and having a first terminal coupled to a first contact ball in the first subset of the contact balls and a second terminal coupled to a second contact ball in the second subset of the contact balls.

18 Claims, 9 Drawing Sheets

(51) Int. Cl.
| | |
|---|---|
| *H01L 49/02* | (2006.01) |
| *H01L 23/00* | (2006.01) |
| *H01L 25/18* | (2006.01) |
| *H05K 1/18* | (2006.01) |
| *H01L 23/538* | (2006.01) |
| *H01L 23/48* | (2006.01) |
| *H01L 23/58* | (2006.01) |
| *H01L 23/488* | (2006.01) |
| *H01L 23/498* | (2006.01) |
| *H01L 27/07* | (2006.01) |
| *H01L 27/02* | (2006.01) |
| *H01L 27/06* | (2006.01) |

(52) U.S. Cl.
CPC .......... *H01L 23/498* (2013.01); *H01L 23/528* (2013.01); *H01L 23/5286* (2013.01); *H01L 23/538* (2013.01); *H01L 23/5386* (2013.01); *H01L 23/58* (2013.01); *H01L 23/642* (2013.01); *H01L 24/14* (2013.01); *H01L 24/17* (2013.01); *H01L 24/18* (2013.01); *H01L 24/25* (2013.01); *H01L 25/18* (2013.01); *H01L 27/0288* (2013.01); *H01L 27/0629* (2013.01); *H01L 27/0733* (2013.01); *H05K 1/181* (2013.01); *H01L 2924/1205* (2013.01); *H01L 2924/1433* (2013.01); *H01L 2924/15311* (2013.01); *H01L 2924/381* (2013.01); *H05K 2201/10015* (2013.01); *H05K 2201/10159* (2013.01); *H05K 2201/10734* (2013.01)

(58) Field of Classification Search
CPC . H01L 24/25; H01L 27/0288; H01L 27/0629; H01L 27/0733; H01L 28/40
See application file for complete search history.

(56) References Cited

U.S. PATENT DOCUMENTS

| | | | |
|---|---|---|---|
| 9,257,834 B1* | 2/2016 | Moghe | H01L 23/3135 |
| 9,553,079 B1* | 1/2017 | Audet | H01L 24/17 |
| 9,660,017 B2* | 5/2017 | Yeh | H01L 28/40 |
| 2002/0071293 A1* | 6/2002 | Eden | H01L 29/4238 |
| | | | 363/20 |
| 2003/0218235 A1 | 11/2003 | Searls et al. | |
| 2004/0256133 A1 | 12/2004 | Dishongh et al. | |
| 2006/0108607 A1* | 5/2006 | Teshima | H01L 24/17 |
| | | | 257/207 |
| 2006/0166398 A1 | 7/2006 | Chan | |
| 2007/0187836 A1* | 8/2007 | Lyne | H01L 25/0657 |
| | | | 257/777 |
| 2008/0258529 A1* | 10/2008 | Maruno | B60N 2/015 |
| | | | 297/257 |
| 2009/0059545 A1* | 3/2009 | Shioga | H01G 9/048 |
| | | | 361/782 |
| 2009/0169217 A1 | 7/2009 | Meagher et al. | |
| 2012/0269489 A1* | 10/2012 | Park | H05K 1/114 |
| | | | 386/224 |
| 2013/0026550 A1 | 1/2013 | Yoshioka | |
| 2013/0062762 A1 | 3/2013 | Chan et al. | |
| 2014/0091428 A1* | 4/2014 | Hossain | H01L 24/82 |
| | | | 257/532 |
| 2014/0252544 A1 | 9/2014 | Li et al. | |
| 2015/0359102 A1* | 12/2015 | Kubo | H01L 23/642 |
| | | | 361/768 |
| 2018/0012838 A1 | 1/2018 | Arvin et al. | |
| 2018/0204827 A1* | 7/2018 | Betsui | H01L 25/16 |
| 2018/0254252 A1* | 9/2018 | Nakagawa | H01L 22/12 |

OTHER PUBLICATIONS

Bonk, René. "SOA for future PONs." Optical Fiber Communication Conference, Optical Society of America, pp. Tu2B-4, Mar. 11, 2018.

Greco, Joseph A. "Design of the high-speed framing, FEC, and interleaving hardware used in a 5.4km free-space optical communication experiment." Free-Space Laser Communications IX. Ed. Arun K. Majumdar & Christopher C. Davis, Proc. of SPIE, vol. 7464, 2009.

Dar, Ronen, et al. "Cost-Optimized Submarine Cables Using Massive Spatial Parallelism" Journal of Lightwave Technology, vol. 36, No. 18, pp. 3855-3865, Sep. 15, 2018.

Li, Ming, et al. "Reconfigurable Optical Signal Processing Based on a Distributed Feedback Semiconductor Optical Amplifier" Nature, Scientific Reports, vol. 6, Article No. 19985, Jan. 27, 2016.

Renaudier, Jeremie, et al. "First 100-nm continuous-band WDM transmission system with 115Tb/s transport over 100km using novel ultra-wideband semiconductor optical amplifiers" In 2017 European Conference on Optical Communication (ECOC), pp. 1-3, Sep. 17, 2017.

Wikipedia, "Noisy-channel coding theorem" Wikipedia, Retrieved from URL: https://en.wikipedia.org/wiki/Noisy-channel_coding_theorem on Aug. 23, 2018, 6 pages.

International Search Report and Written Opinion for International Application No. PCT/US2019/060447 dated Feb. 24, 2020. 14 pages.

Office Action for Taiwanese Patent Application No. 108141537 dated Jul. 24, 2020. 6 pages.

Office action for Taiwanese Patent Application No. 108141537 dated Nov. 18, 2020. 6 pages.

\* cited by examiner

HIGH DENSITY BALL GRID ARRAY (BGA) PACKAGE CAPACITOR DESIGN

CROSS REFERENCE TO RELATED APPLICATIONS

This application claims the benefit of U.S. Provisional Patent Application No. 62/767,922, filed Nov. 15, 2018, the entire contents and substance of which are incorporated by reference herein.

BACKGROUND

A ball grid array (BGA) is a type of package for integrated circuits having a large number of interconnects. A BGA package includes a number of electrical contacts on a bottom side for providing electrical connections between the integrated circuit and a printed circuit board (PCB) on which the BGA package is mounted. The contacts take the form of solder balls, or "contact balls", on copper pads on the bottom side of the BGA package. The contact balls supply voltage and power to the integrated circuit, and provide paths for electrical signals traveling to and from the integrated circuit. Usable area on a top side of the BGA package is limited by multiple factors such as: the circuit components, area for under fill epoxy, for a lid or structure ring attachment, and for adhesive bleed out. Real estate on a bottom side of the BGA package is limited by the typically dense array of contact balls. Traditionally, the PCB on which the BGA package is mounted includes capacitors to smooth ripple in the power supply voltages.

SUMMARY

According to one implementation of the present disclosure an integrated circuit package includes a substrate having a first side and a second side opposite the first side, an integrated circuit component coupled to the second side of the substrate, and a ball grid array formed on the first side of the substrate. The ball grid array includes multiple contact balls arranged in a pattern. Each of a first subset of the contact balls is electrically coupled to a first voltage input of an integrated circuit component, and each of a second subset of the contact balls is electrically coupled to a second voltage input of the integrated circuit component. The integrated circuit package also includes a capacitor mounted to the first side and having a first terminal coupled to a first contact ball in the first subset of the contact balls and a second terminal coupled to a second contact ball in the second subset of the contact balls.

In some implementations of the above integrated circuit package the first voltage input is a drain voltage input of a complementary, metal-oxide-semiconductor circuit, and the second voltage input is a sink voltage input of the complementary, metal-oxide-semiconductor circuit. In some implementations of the above integrated circuit package, the ball grid array has a pitch of 1.27 millimeters or less. In some implementations of the above integrated circuit package, the first contact ball and the second contact ball are neighbors in the ball grid array. In some implementations of the above integrated circuit package, the first contact ball and the second contact ball are adjacent to one another in the ball grid array along a diagonal direction with respect to the pattern. In some implementations, the above integrated circuit package further includes a bridge electrically coupling a third contact ball with at least one of the first contact ball or the second contact ball. In some implementations of the above integrated circuit package, the capacitor includes a capacitor body disposed over an insulating layer on the first side of the substrate. In some implementations of the above integrated circuit package, each contact ball has a height that extends further from the first side of the substrate than a height of the capacitor. In some implementations of the above integrated circuit package, each terminal of the capacitor is in electrical contact with the contact ball through a contact pad, and the contact pad is disposed over a dielectric layer deposited on the first side of the substrate and under an insulating layer deposited over the dielectric layer. In some implementations of the above integrated circuit package, a gap between a third contact ball and the first terminal avoids arcing between the contact ball and the first terminal.

According to one implementation of the present disclosure, a system includes a printed circuit board and an integrated circuit package mounted on the printed circuit board. The integrated circuit package includes a substrate having a first side and a second side opposite the first side, an integrated circuit component coupled to the second side of the substrate, and a ball grid array formed on the first side of the substrate. The ball grid array includes multiple contact balls arranged in a pattern. Each of a first subset of the contact balls is electrically coupled to a first voltage input of an integrated circuit component, and each of a second subset of the contact balls is electrically coupled to a second voltage input of the integrated circuit component. The integrated circuit package also includes a capacitor mounted to the first side and having a first terminal coupled to a first contact ball in the first subset of the contact balls and a second terminal coupled to a second contact ball in the second subset of the contact balls.

In one implementation of the above system, in the integrated circuit package, the first voltage input is a drain voltage input of a complementary, metal-oxide-semiconductor circuit, and the second voltage input is a sink voltage input of the complementary, metal-oxide-semiconductor circuit. In one implementation of the above system, in the integrated circuit package, the ball grid array has a pitch of 1.27 millimeter or less. In one implementation of the above system, in the integrated circuit package, the first contact ball and the second contact ball are neighbors in the ball grid array. In one implementation of the above system, the integrated circuit package further includes a bridge electrically coupling a third contact ball with at least one of the first contact ball or the second contact ball. In one implementation of the above system, in the integrated circuit package, the capacitor includes a capacitor body disposed over an insulating layer on the first side of the substrate. In one implementation, the above system further includes a memory circuit package mounted on the printed circuit board, the memory circuit package storing instructions or data for processing by the integrated circuit component of the integrated circuit package. In one implementation, the above system further includes a board capacitor mounted on the printed circuit board, the board capacitor having a drain voltage terminal coupled with a first power terminal providing a drain voltage to the integrated circuit component and a sink voltage terminal coupled with a second power terminal providing a sink voltage to the integrated circuit component. In one implementation, the above system further includes a first power terminal mounted on the printed circuit board and coupled to the first contact ball and a second power terminal mounted on the printed circuit board and coupled to the second contact ball. In one implementation, the above system further includes a memory circuit package mounted on the printed circuit board, wherein the memory circuit package includes a second ball grid array at a bottom side, the second ball grid array including multiple contact balls, wherein the second ball grid array includes a second capacitor having a drain voltage terminal coupled with a drain voltage contact ball and a sink voltage terminal coupled with a sink voltage contact ball, and wherein the drain voltage contact ball and the sink voltage contact ball are selected from the second ball grid array.

BRIEF DESCRIPTION OF THE DRAWINGS

In the figures, elements with the same or similar reference numerals have the same or similar function or steps, unless otherwise indicated.

DETAILED DESCRIPTION

In the following detailed description, numerous specific details are set forth to provide a full understanding of the present disclosure. It will be apparent, however, to one having ordinary skill in the art that the implementations of the present disclosure can be practiced without some of these specific details. In other instances, well-known structures and techniques have not been shown in detail so as not to obscure the disclosure.

The system disclosed herein relates to integrated circuit packaging. More specifically, systems disclosed herein provide packaging solutions for integrated circuits with added capacitance on a 'bottom' side of the package to support high frequency and high current operating conditions.

Modern large integrated circuit devices, such as application-specific integrated circuits (ASICs) and general-purpose processors, may operate at high frequency, high power specifications, thereby necessitating extra capacitive resources coupled to the circuitry to avoid inductive effects that can reduce power supply voltages when current to the integrated circuit increases sharply, such as when a computationally intensive process begins. The resulting voltage drop may reduce the speed of the circuit, increase interference, and increase error rates. Bypass capacitors are used to reduce this voltage ripple on the power supply connections to the integrated circuits. The capacitors are more effective the closer they are in the circuit to the load; that is, the integrated circuit. Ball grid array (BGA) packages, which are commonly used for integrated circuits with many interconnects and large power requirements, have limited real estate in which to place capacitors. Previous approaches to placing the capacitors closer to the integrated circuit in a BGA package have involved removing contact balls on a bottom side of the BGA package. However, removing contact balls from the BGA package has a negative effect on overall circuit performance because of the increased current throughput in the fewer contact balls remaining in the BGA. Beyond a fundamental limit for current throughput, irreversible effects in the contact balls put the long-term reliability of the packaged circuit at risk. Even continuous high current throughput within the specifications of the contact balls may damage the contact balls, if extended beyond a period of time. Moreover, future integrated circuit designs are expected to operate at increased power, requiring more current for chip operation. Accordingly, the problem of increasing capacitance resources of integrated circuit packages will likely worsen in the future.

Implementations as disclosed herein combine a capacitor pad and a BGA pad into a single unit so that package capacitors can be placed on the bottom side of the circuit package without removing contact balls. This allows the package designer to add capacitance close to the load—e.g., the integrated circuit—without jeopardizing the long-term reliability of contact balls. In some implementations, the BGA pad and the capacitor pad are combined with the capacitors bridging adjacent contact balls. In a two terminal capacitor, one terminal is connected to power (e.g., a drain voltage, VDD) and the other is connected to ground (e.g., a sink source voltage, VSS). Adjacent BGA pads can be designed likewise as power and ground with combined pad structures so the capacitor can be placed between pads without removing contact balls from the BGA.

BGA designs typically follow standard spacing rules, for example, a 1.27 mm or 1.0 mm pitch. Different size standard capacitors can be used with these different BGA pitches. Also, custom BGA pitches are possible to align with a variety of capacitor sizes.

Figure 1:
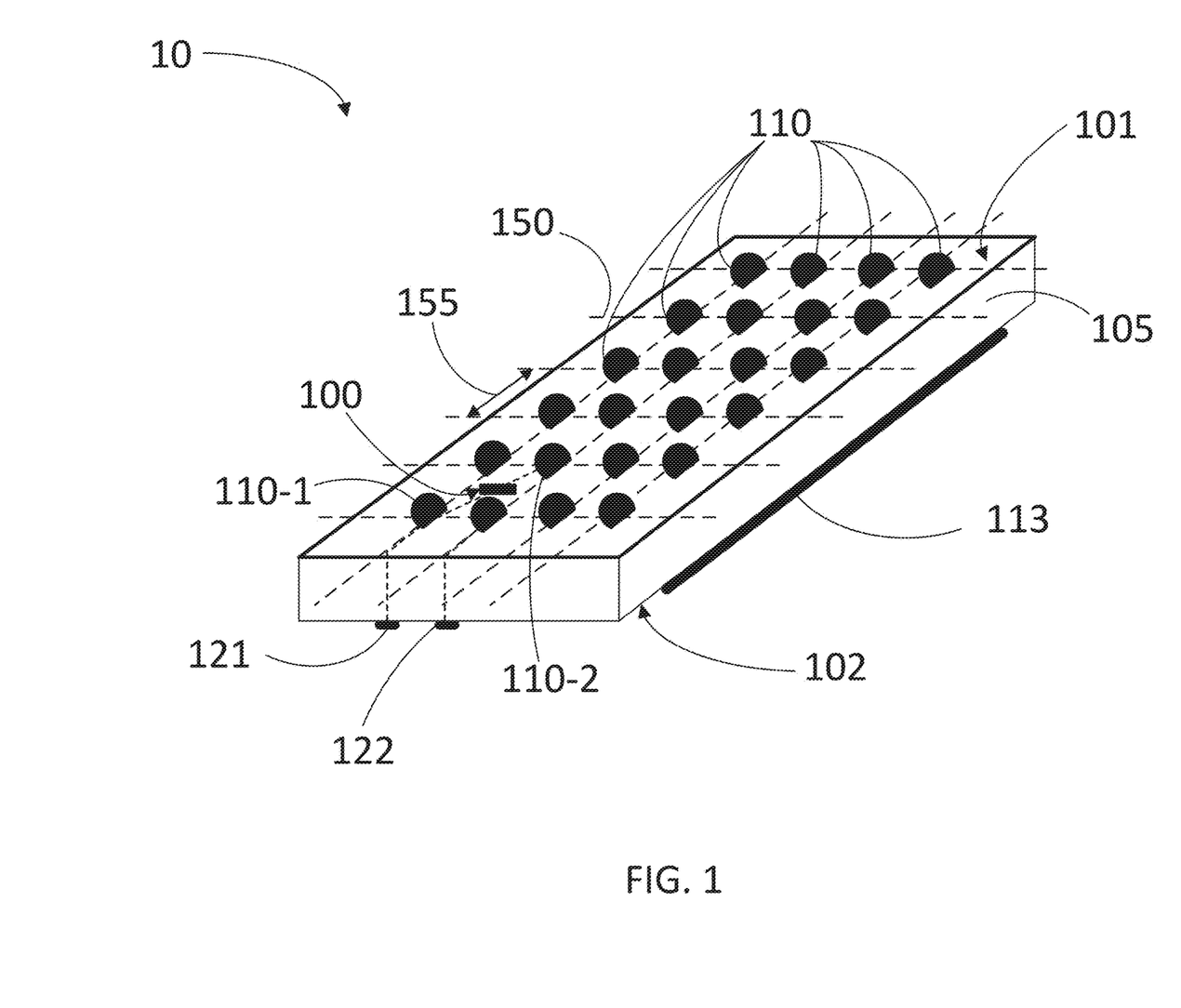
FIG. 1 illustrates a bottom side of an integrated circuit package, according to some implementations.

FIG. 1 illustrates a bottom side of an integrated circuit package 10, according to some implementations. In some implementations, the integrated circuit package 10 may include an integrated circuit component, such as an ASIC, configured to perform a specific application in a system that is part of an electronic appliance (e.g., a GPS-based application in a mobile device). A BGA 150 formed on a first side 101 of a silicon substrate 105 includes multiple contact balls 110 arranged in a pattern. Some of the contact balls 110 are electrically coupled to a first voltage input 121 of an integrated circuit component 113, and some of the contact balls 110 are electrically coupled to a second voltage input 122 of the integrated circuit component 113. The integrated circuit component 113 is disposed on a second side 102 of the silicon substrate 105, opposite to the first side. Some of the contact balls 110 couple input/output signals to the integrated circuit package. Without limiting the present disclosure, the pattern of the ball grid array 150 may be square, rectangular, diagonal, rhomboidal, or any other lattice configuration. In some implementations, the pattern of the BGA 150 may be asymmetrical, or have a limited symmetry. More generally, a measure of the size of the BGA 150 may be a pitch 155, which in the case of a square lattice may be defined as a lateral side of the unit cell in the lattice.

In some implementations, the integrated circuit package 10 includes a capacitor 100 having a first terminal coupled with a first contact ball 110-1 that is electrically coupled with the first voltage input 121 and a second terminal coupled with a second, neighboring contact ball 110-2 that is electrically coupled with the second voltage input 122. In some implementations, the first contact ball 110-1 and the second contact ball 110-2 may be nearest neighbors in the BGA 150. In some implementations, the first contact ball 110-1 and the second contact ball 110-2 may be adjacent to one another in the ball grid array along a diagonal direction.

In some implementations the first voltage input 121 is coupled to a drain voltage (VDD) in a complementary, metal-oxide-semiconductor (CMOS) device of the integrated circuit component 113, and the second voltage input 122 is coupled to a sink voltage (VSS) in a CMOS device of the integrated circuit component 113.

Figure 2A:
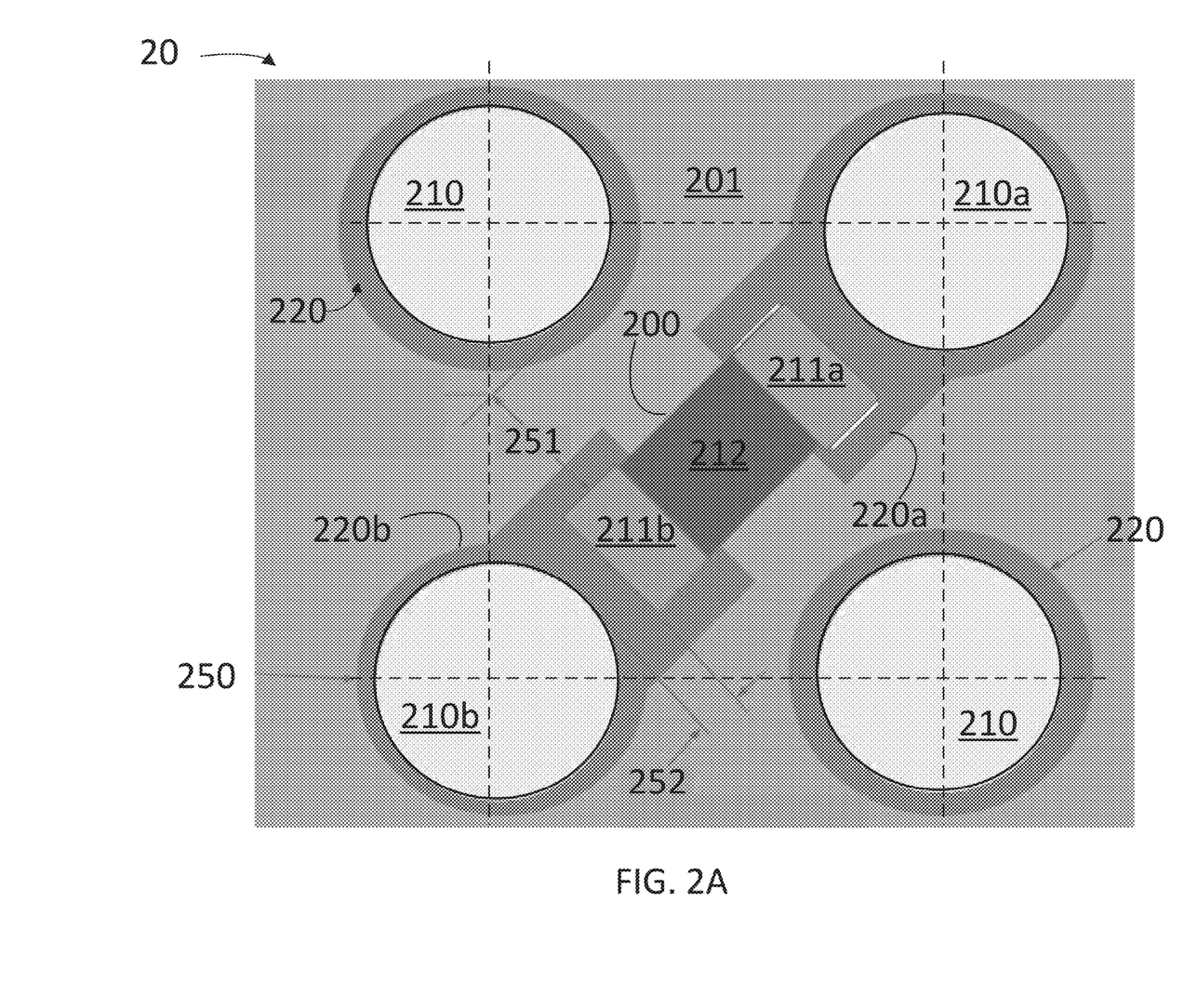
FIG. 2A illustrates a plan view of a bottom side of an integrated circuit package including a capacitor between diagonally adjacent contact balls, according to some implementations.

FIG. 2A illustrates a plan view of contact pads for a capacitor on a bottom side 201 of an integrated circuit package 20 including a capacitor 200 between adjacent contact balls 210*a* and 210*b* (hereinafter, collectively referred to as "the contact balls 210"), according to some implementations. The contact balls 210 are electrically coupled to circuit components on the opposite side of the ASIC package 20 via contact pads 220. The contact balls 210*a* and 210*b* may be diagonally adjacent to one another in a square BGA 250 (e.g., the contact balls 210*a* and 210*b* are neighbors along a diagonal direction), thereby allowing for the length of the capacitor 200 to fit in the BGA 250 without removing the contact balls 210. This allows the package designer to adjust the capacitor 200 to add a desired capacitance to the ASIC package 20 without jeopardizing the long term reliability of the contact balls 210. In this disclosure, the BGA pads 220 and the capacitor pad are combined into the merged pads 220*a* and 220*b*, so the capacitor 200 can be placed between the contact balls 210*a* and 210*b*. In a typical two terminal capacitor, one terminal (e.g., the terminal 211*a*) may be electrically coupled to power (e.g., a drain voltage VDD) and the other (e.g., the terminal 211*b*) may be electrically coupled to ground (e.g., a sink voltage VSS, ground, or a "bulk" voltage). The terminal 211*a* and the terminal 211*b* will be collectively referred to, hereinafter, as "the terminals 211." Adjacent merged pads 220*a* and 220*b* are designed as power and ground contact pads enabling the placement of capacitor 200 between the BGA pads 220 without depopulating the contact balls 210. A capacitor body 212 provides the bulk capacitance to the capacitor 200. In some implementations, the capacitor body 212 includes multiple conductive (e.g., metallic) fingers in contact with the capacitor terminals and interspaced by a dielectric material.

In some implementations, the capacitor 200 is placed in the BGA 250 by considering a gap distance 251 and 252 between the capacitor terminals 211 and the contact balls 210. Given the symmetry of the BGA 250, the gap distance 251 may be larger than the gap distance 252, and both may be larger than a minimum value, to avoid arcing; that is, electric breakdown between the capacitor terminals 211 that have different voltages from the contact balls 210. In some implementations, it is expected that gap 252 is smaller than the gap 251, as the terminal 211*b* is in fact electrically coupled to the contact ball 210*b* via the merged pad 220*b*. In some implementations, the gap distance 251 may be about 0.330 mm and the gap distance 252 may be about 0.090 mm, or more. In some implementations, a minimum gap for 252 may be zero mm because the BGA ball and the capacitor terminal can be electrically coupled.

Figure 2B:
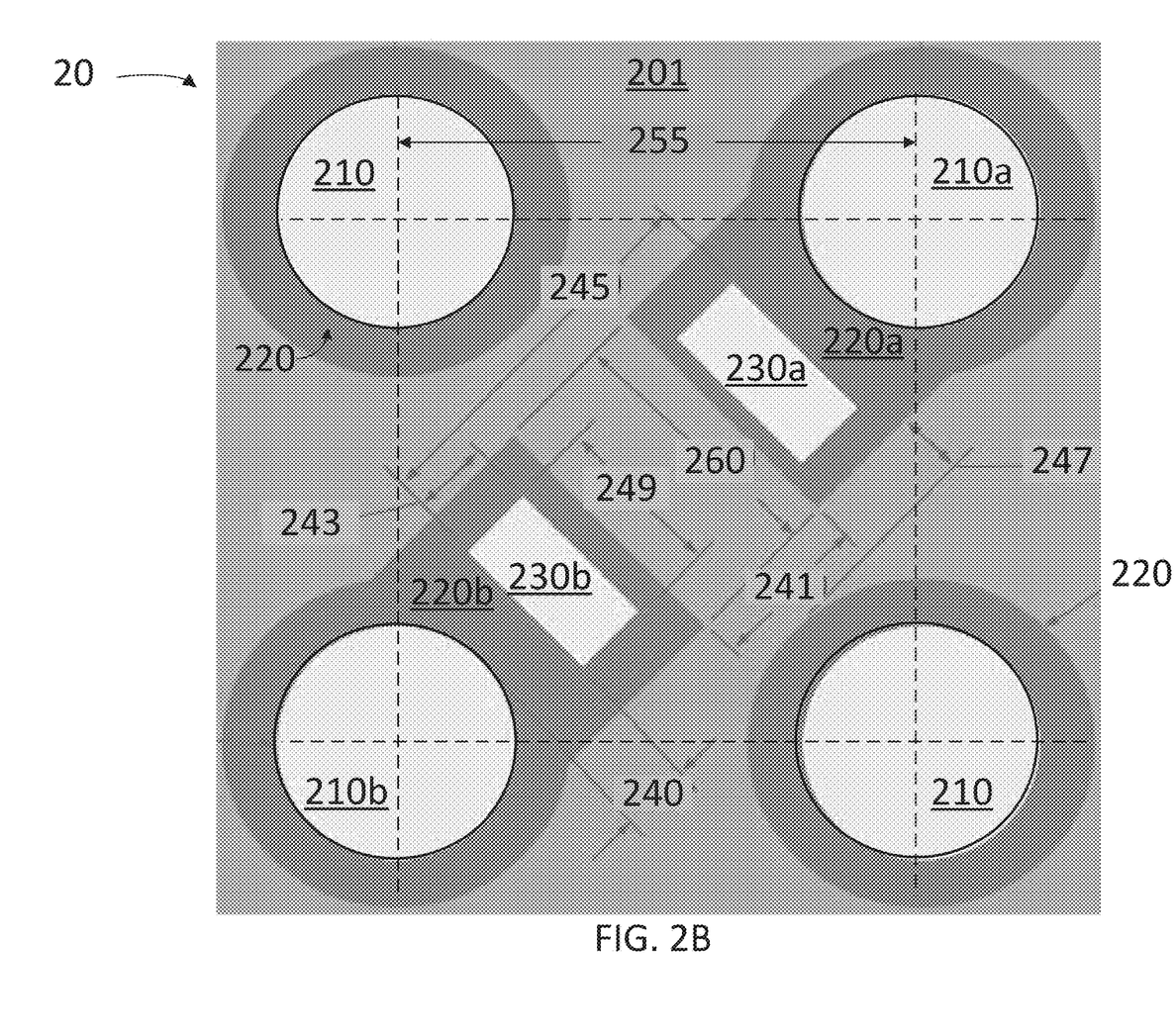
FIG. 2B illustrates a plan view of contact pads for a capacitor on the bottom side of an integrated circuit package, according to some implementations.

FIG. 2B illustrates another plan view of the bottom side 201 the integrated circuit package 20 shown in FIG. 2A with the capacitor 200 removed. FIG. 2B shows underlying details of the contact pads 220 on the bottom side 201 of the integrated circuit package 20, according to some implementations. The contact pads 220 may include the BGA pads and also the merged pads 220*a* and 220*b*, including contact regions 230*a* and 230*b* for the terminals of the capacitor, e.g., terminals 211 in capacitor 200, (hereinafter, collectively referred to as "the contact regions 230"). A contact region is a portion of the bottom side of the integrated circuit package 20 where the insulator layer is removed to allow for contact with a capacitor terminal. The contact regions 230 may have a rectangular shape with a width 243 and a length 249. The merged pads 220 may include a tab having a width 260. The tabs of the merged pads 220*a* and 220*b* may be separated by a gap 241, forming a total length 245 for the capacitor 200. A gap 247 is formed between a contact ball 210 electrically insulated from the capacitor 200.

Without limitation, the BGA 250 may follow different spacing rules. For example, a pitch 255 between adjacent contact balls may be 1.27 mm, or less (e.g., 1.0 mm, or even less). In such configurations, the capacitors 200 may include different standard sizes (e.g., the length 249). Some implementations include a custom the BGA pitch 255 enabling a variety of the capacitor lengths 249, as desired.

Figure 2C:
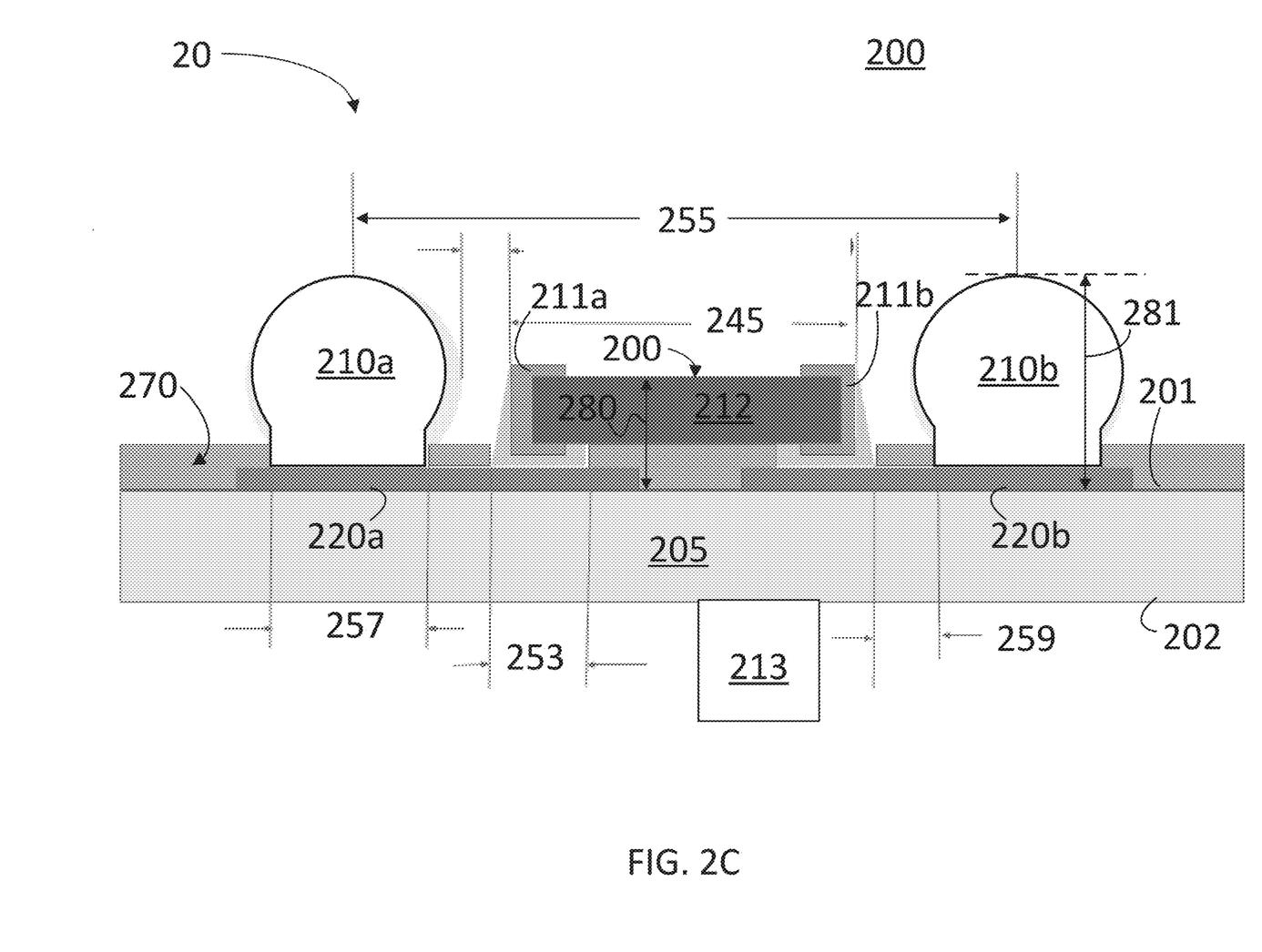
FIG. 2C illustrates a cross-section view of an integrated circuit in an integrated circuit package including one capacitor between adjacent contact balls, according to some implementations.

FIG. 2C illustrates a cross-section view of the integrated circuit package 20 including the capacitor 200 between adjacent contact balls 210*a* and 210*b*, according to some implementations. The contact balls 210 and the capacitor 200 are disposed on the bottom side 201 of the silicon substrate 205. The silicon substrate has a top side 202 opposite to the bottom side 201. The contact balls are separated by a pitch 255. The integrated circuit components 213 may be disposed on the front side 202 of the silicon substrate 205. Other dimensions in integrated circuit package 20 include a width 257 of the contact region for contact balls 210, a width 253 of the contact region for the terminals 211 of the capacitor 200, and a spacing 259 between the contact regions for a capacitor terminal and a closest contact ball, filled with an insulating layer 270. In some implementations, the pitch 255 can be between 0.425 mm and 1.78 mm. In some implementations, a width 257 can be between 0.18 mm and 0.75 mm. In some implementations, the width 253 can be between 0.1 mm and 0.25 mm. In some implementations, a height 280 can be between 0.3 mm and 0.6 mm. In some implementations, a width 245 can be between 0.4 mm and 1.0 mm. In some implementations, a height 281 can be between 0.2 mm and 0.8 mm. In some implementations, a gap 259 can be between 0 mm (i.e., connected) and 0.135 mm.

The capacitor body 212 includes alternating layers of conductor and dielectric material within an electrically insulating package. The capacitor 200 is mounted over the bottom side 201 of the integrated circuit package 20, in some cases over the insulating layer 270, such as a solder mask. The capacitor 200 has two terminals 211*a* and 211*b*, which are soldered to merged pads 220*a* and 220*b*, which also provide an electrical connection to the contact balls 210. A height 280 of the capacitor 200 with respect to the bottom side 201 is lower than a profile 281 of the contact balls 210. The terminals 211 are in electrical contact with the contact balls 210 through the merged pads 220*a* and 220*b* formed over a silicon substrate 205 and under the insulating layer 270 on the bottom side 201 of the ASIC package 20, in some implementations the silicon substrate includes the circuit component.

FIGS. 3A-D include partial views of the bottom side of the integrated circuit packages 30A, 30B, 30C and 30D (hereinafter, collectively referred to as "the integrated circuit packages 30"), respectively, including different arrangements for capacitors, consistent with implementations disclosed herein. The integrated circuit packages 30 include the contact pads 320, which also include the merged pads 320a for first capacitor terminals and first contact balls carrying a first voltage, and the merged pads 320b for second capacitor terminals and second contact balls carrying a second voltage (contact balls and capacitors are not shown in the figures, for clarity).

Figure 3A:
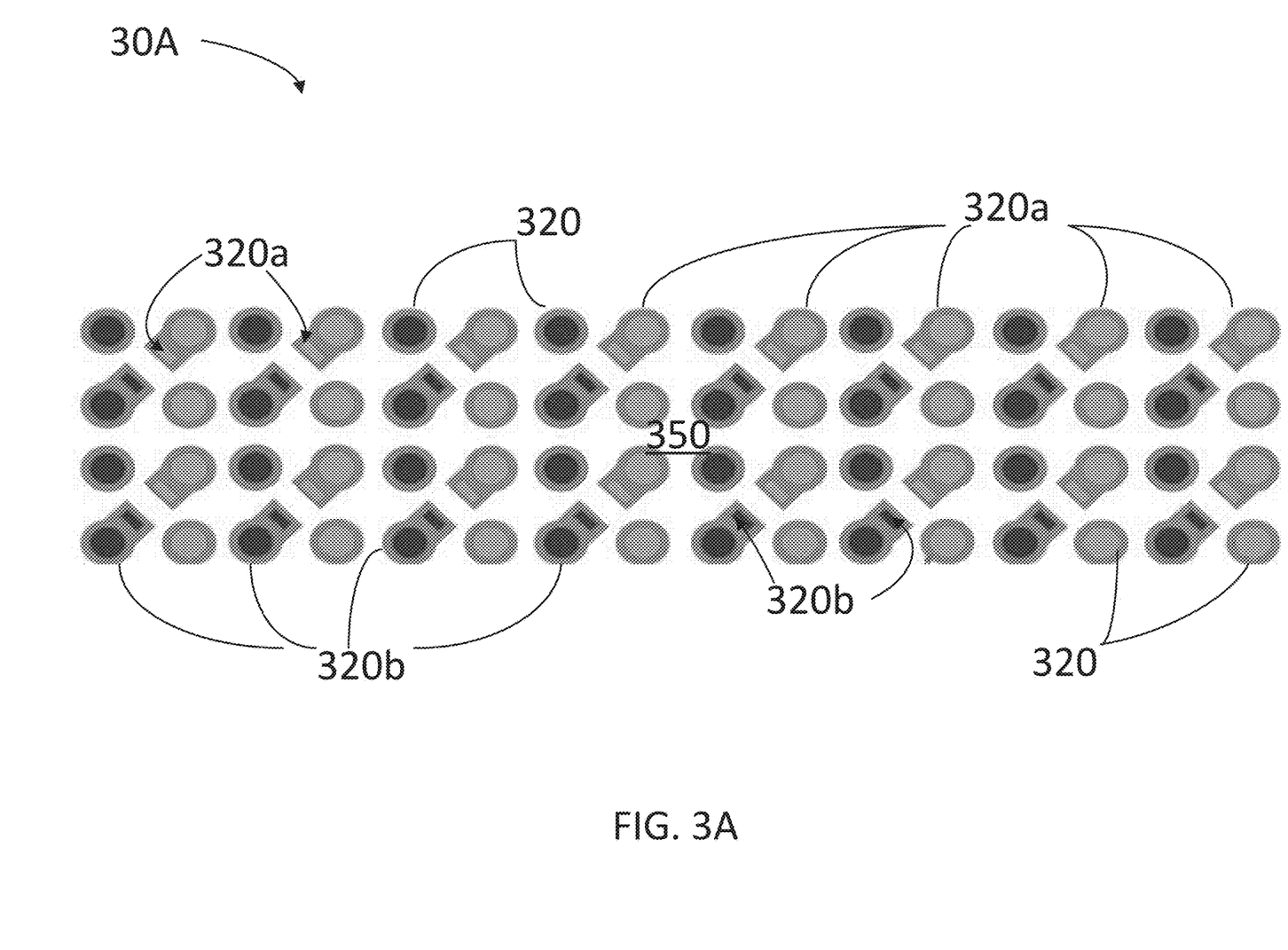
FIG. 3A illustrates a partial view of a bottom side of an integrated circuit package including contact balls for multiple capacitors in a first pattern, according to some implementations.

FIG. 3A illustrates a partial view of the bottom side of the integrated circuit package 30A including the contact pads 320 for multiple capacitors in a first pattern, according to some implementations. The first pattern includes capacitors coupled across contact balls that are diagonal neighbors. In some implementations the BGA 350 is a square lattice with contact balls coupled to positive and negative voltage inputs alternatively, by column.

Figure 3B:
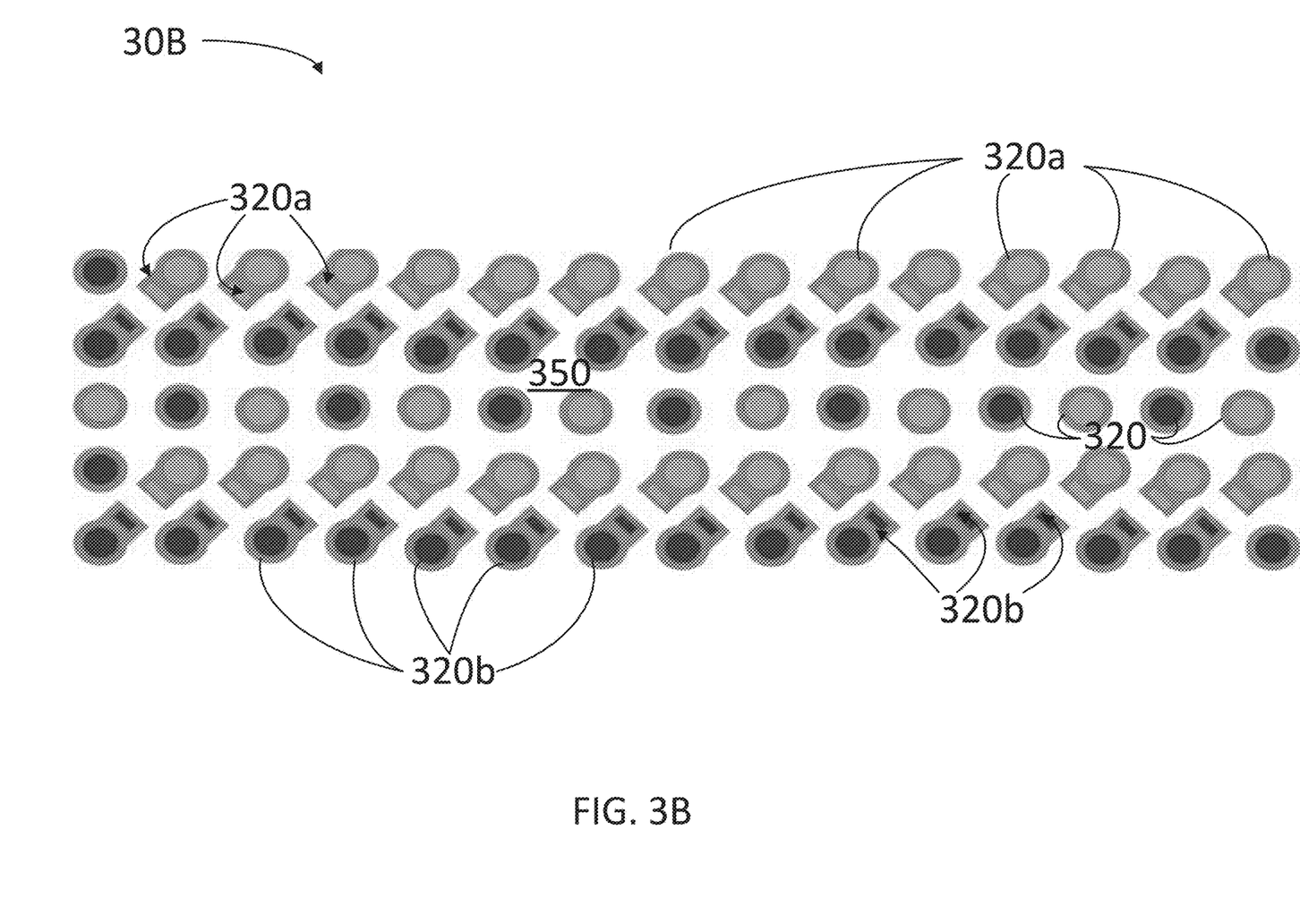
FIG. 3B illustrates a partial view of a bottom side of an integrated circuit package including multiple capacitors in a second pattern, according to some implementations.

FIG. 3B illustrates a partial view of the bottom side of the integrated circuit package 30B including the contact pads 320 for multiple capacitors a second pattern, according to some implementations. The second pattern includes capacitors coupled across contact balls that are diagonal neighbors. In some implementations the BGA 350 is a square or rhomboidal lattice and the contact pads 320a and 320b are coupled to positive and negative voltage inputs alternatively, by row.

Figure 3C:
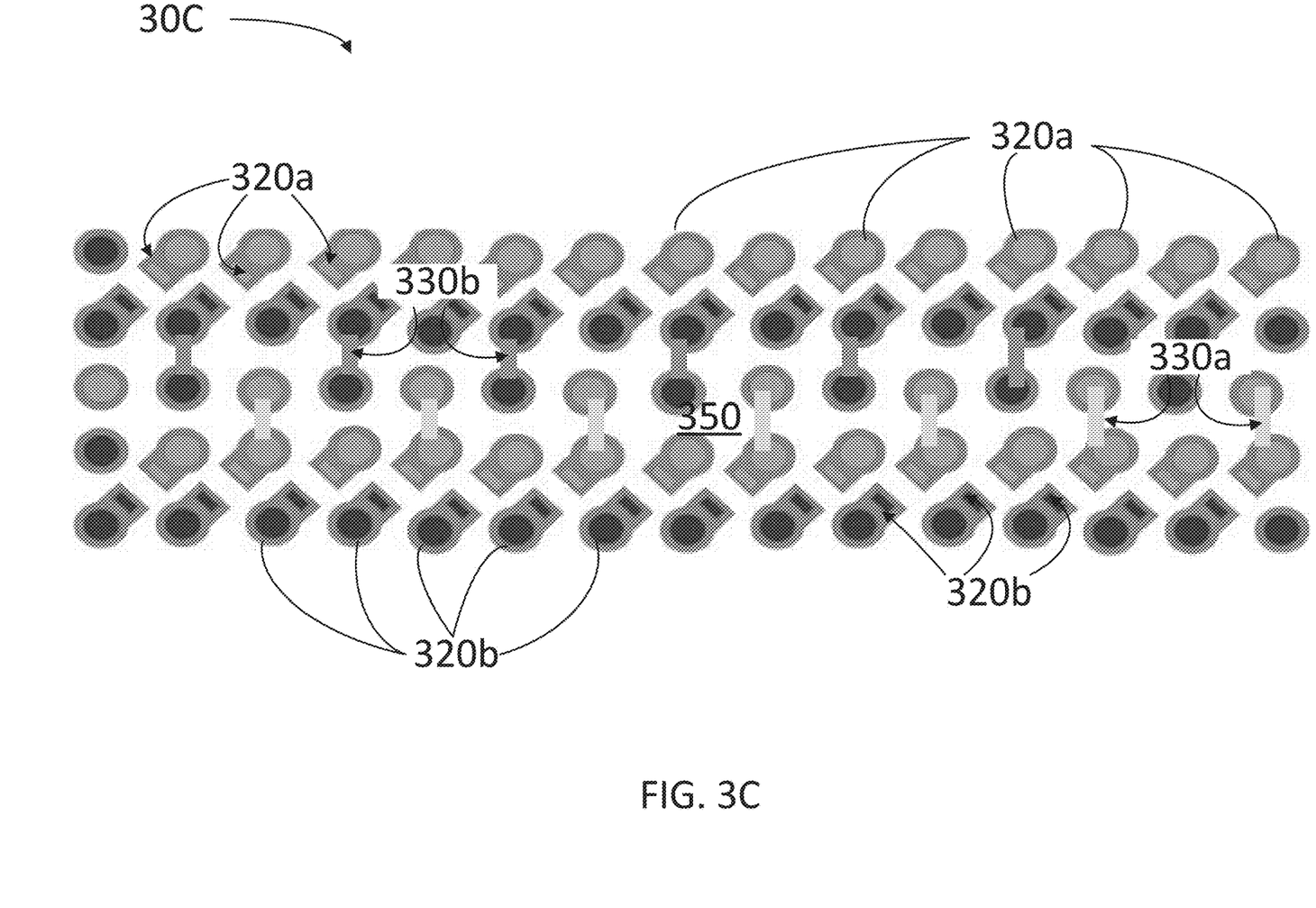
FIG. 3C illustrates a partial view of a bottom side of an integrated circuit package including multiple capacitors in a third pattern, according to some implementations.

FIG. 3C illustrates a partial view of the bottom side of the integrated circuit package 30C including the contact pads 320 for multiple capacitors in a bridged pattern, according to some implementations. The bridged pattern includes capacitors coupled across contact balls that are diagonal neighbors. In some implementations the BGA 350 is a square or rhomboidal lattice with contact pads coupled to positive and negative voltage inputs alternatively, by row. Additionally, the bridged pattern includes positive bridges 330a and negative bridges 330b (hereinafter, collectively referred to as "the bridges 330"). The bridges 330 electrically couple more than one contact pad 320 to a given capacitor terminal, which can allow a single capacitor to provide capacitance to more than one contact ball. In many cases, however, the bridges 330 may be redundant because the VDD pads will be connected to each other within the package, as will the VSS pads.

Figure 3D:
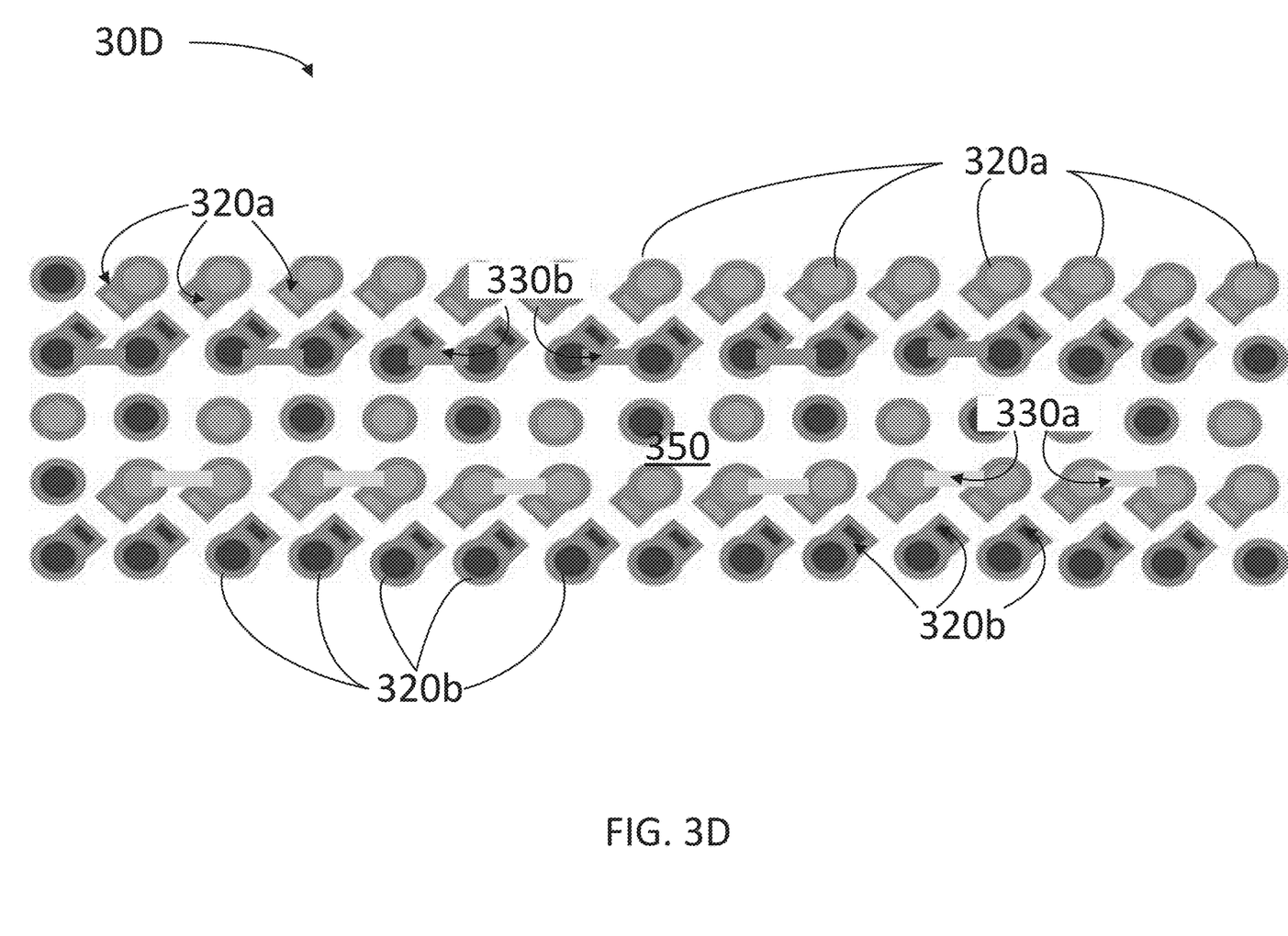
FIG. 3D illustrates a partial view of a bottom side of an integrated circuit package including multiple capacitors in a fourth pattern, according to some implementations.

FIG. 3D illustrates a partial view of the bottom side of an integrated circuit package 30D including multiple capacitors in a second bridged pattern, according to some implementations. The second bridged pattern includes capacitors bridging contact balls that are diagonal neighbors. In some implementations the BGA 350 is a square or rhomboidal lattice with contact pads that can be coupled to positive, negative, and/or ground voltage inputs alternatively, by row. Additionally, the bridged pattern includes the positive bridges 330a and the negative bridges 330b (hereinafter, collectively referred to as "the bridges 330") coupling the capacitor terminals in parallel. Accordingly, implementations consistent with the integrated circuit package 30D may include an increased capacitance.

Figure 4:
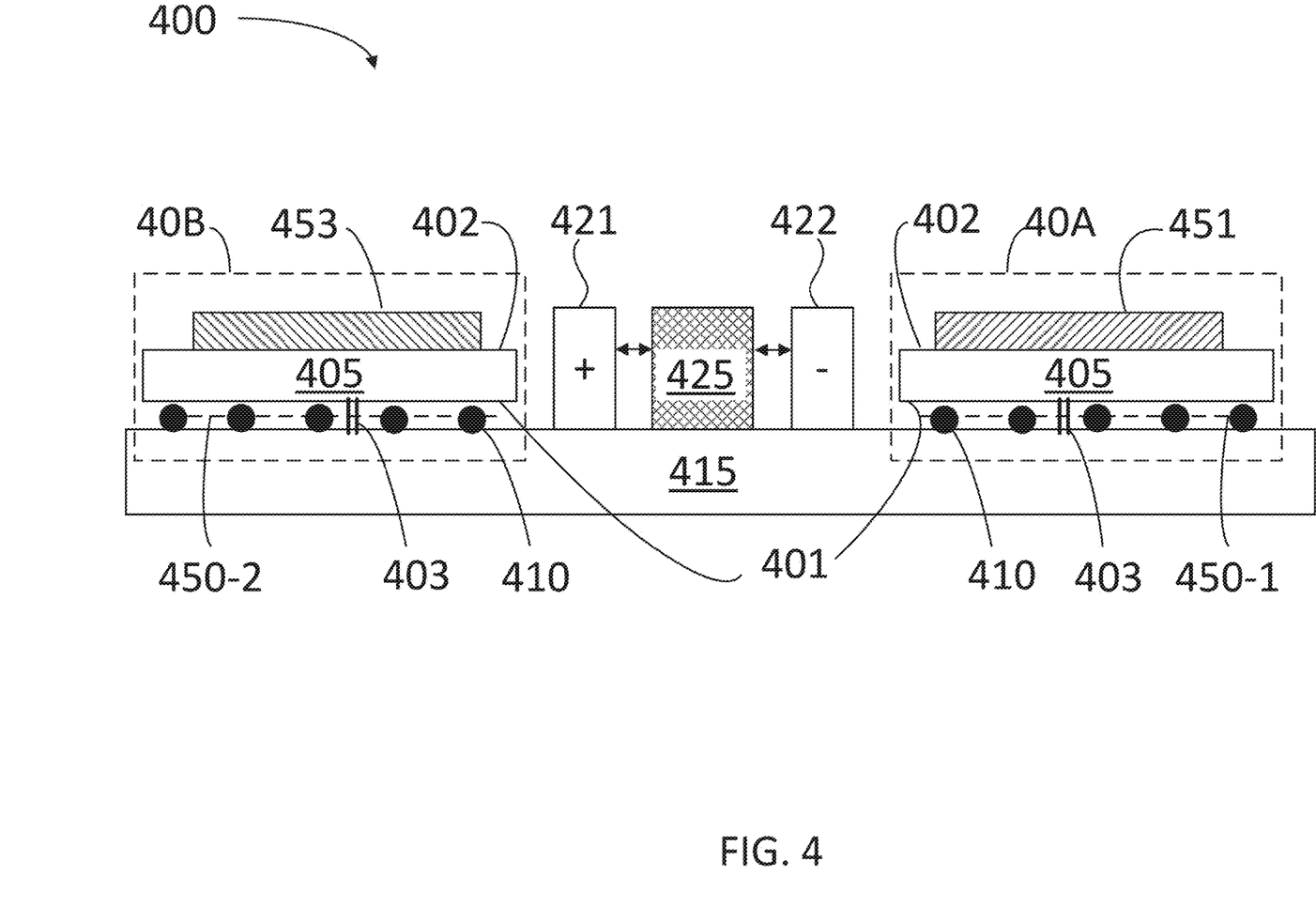
FIG. 4 illustrates a cross-sectional view of a system including an integrated circuit package and a memory circuit package mounted on a printed circuit board, according to some implementations.

FIG. 4 illustrates a cross-sectional view of a system 400 including an integrated circuit package 40A and a memory circuit 40B, mounted on a printed circuit board (PCB) 415, according to some implementations. The system 400 includes a memory circuit package 40B storing data and/or instructions and an integrated circuit package 40A including an integrated circuit 451 configured to execute the instructions or process the data stored in the memory circuit package 40B. The integrated circuit package 40A includes a ball grid array 450-1 formed on a bottom side 401 of a silicon substrate 405 in the integrated circuit package 40A. In some implementations, the ball grid array 450-1 includes multiple contact balls 410 arranged in a pattern (e.g., ball grid arrays 150 and 350). Each of a subset of the contact balls 410 is electrically coupled to a first voltage input or a second voltage input of the integrated circuit 451 on a top side 402 opposite to the bottom side 401. The integrated circuit package 40A also includes a capacitor 403 having a first terminal coupled with a first contact ball that is electrically coupled with the first voltage input and a second terminal coupled with a second contact ball that is electrically coupled with the second voltage input.

In some implementations, the system 400 is an electronic appliance (e.g., a personal computer, a laptop, a mobile computer, smartphone, palm computer, or the like). In some implementations, the memory circuit package 40B is also packaged with a ball grid array 450-2 on the bottom side 401, with memory blocks 453 on the top side 402 of silicon substrate 405. The ball grid array 450-2 may include a capacitor 403, as disclosed herein. Memory circuit package 40B may include a random access memory (RAM), such as a dynamic RAM (DRAM), or a synchronous RAM (SRAM), accessible by integrated circuit 451 in integrated circuit package 40A.

In some implementations, system 400 may also include a positive power terminal 421 and a negative power terminal 422 mounted on the printed circuit board 415. For example, in some implementations positive power terminal 421 may provide the VDD voltage to a CMOS circuit (e.g., to memory blocks 453 or to integrated circuit 451). Likewise, in some implementations the negative power terminal 422 may provide the VSS voltage to the CMOS circuit. Moreover, in some implementations the positive power terminal 421 and the negative power terminal 422 may be directly coupled to the contact balls 410, which in turn provide voltage to the capacitors 403, to the integrated circuit 451, and to the memory blocks 453. Further, in some embodiments the system 400 includes a board capacitor 425 mounted on the printed circuit board 415. The board capacitor 425 may provide a capacitive relief to the system 400 for low frequency signals (e.g., 30 MHz or less). In some implementations, board capacitor 425 may have a first terminal directly coupled to the positive power terminal 421 and a second terminal directly coupled to the negative power terminal 422.

As used herein, the phrase "at least one of" preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C. To the extent that the term "include," "have," or the like is used in the description or the claims, such term is intended to be inclusive in a manner similar to the term "comprise" as "comprise" is interpreted when employed as a transitional word in a claim.

A reference to an element in the singular is not intended to mean "one and only one" unless specifically stated, but rather "one or more." The term "some" refers to one or more. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

While this specification contains many specifics, these should not be construed as limitations on the scope of what may be claimed, but rather as descriptions of particular implementations of the subject matter. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products. Other variations are within the scope of the following claims.

What is claimed is:

1. An integrated circuit package, comprising:
    a substrate having a first side and a second side opposite the first side;
    an integrated circuit component coupled to the second side of the substrate;
    a ball grid array formed on the first side of the substrate, the ball grid array comprising multiple contact balls arranged in a pattern, wherein each of a first subset of the contact balls is electrically coupled to a first voltage input of the integrated circuit component, and each of a second subset of the contact balls is electrically coupled to a second voltage input of the integrated circuit component; and
    a capacitor mounted to the first side and having a first terminal coupled to a first contact ball in the first subset of the contact balls and a second terminal coupled to a second contact ball in the second subset of the contact balls,
    wherein the first voltage input is a drain voltage input of a complementary, metal-oxide-semiconductor circuit, and the second voltage input is a sink voltage input of the complementary, metal-oxide-semiconductor circuit.

2. The integrated circuit package of claim 1, wherein the ball grid array has a pitch of 1.27 millimeters or less.

3. The integrated circuit package of claim 1, wherein the first contact ball and the second contact ball are neighbors in the ball grid array.

4. The integrated circuit package of claim 1, wherein the first contact ball and the second contact ball are adjacent to one another in the ball grid array along a diagonal direction with respect to the pattern.

5. The integrated circuit package of claim 1, further comprising a bridge electrically coupling a third contact ball with at least one of the first contact ball or the second contact ball.

6. The integrated circuit package of claim 1, wherein the capacitor comprises a capacitor body disposed over an insulating layer on the first side of the substrate.

7. The integrated circuit package of claim 1, wherein each contact ball has a height that extends further from the first side of the substrate than a height of the capacitor.

8. The integrated circuit package of claim 1, wherein each terminal of the capacitor is in electrical contact with the contact ball through a contact pad, wherein the contact pad is disposed over a dielectric layer deposited on the first side of the substrate and under an insulating layer deposited over the dielectric layer.

9. The integrated circuit package of claim 1, wherein a gap between a third contact ball and the first terminal avoids arcing between the contact ball and the first terminal.

10. A system, comprising:
    a printed circuit board; and
    an integrated circuit package mounted on the printed circuit board, wherein the integrated circuit package comprises:
    a substrate having a first side and a second side opposite the first side;
    an integrated circuit component coupled to the second side of the substrate;
    a ball grid array formed on the first side of the substrate, the ball grid array comprising multiple contact balls arranged in a pattern, wherein each of a first subset of the contact balls is electrically coupled to a first voltage input of an integrated circuit component, and each of a second subset of the contact balls is electrically coupled to a second voltage input of the integrated circuit component; and
    a capacitor mounted to the first side and having a first terminal coupled to a first contact ball in the first subset of the contact balls and a second terminal coupled to a second contact ball in the second subset of the contact balls,
    wherein, in the integrated circuit package, the first voltage input is a drain voltage input of a complementary, metal-oxide-semiconductor circuit, and the second voltage input is a sink voltage input of the complementary, metal-oxide-semiconductor circuit.

11. The system of claim 10, wherein, in the integrated circuit package, the ball grid array has a pitch of 1.27 millimeter or less.

12. The system of claim 10, wherein, in the integrated circuit package, the first contact ball and the second contact ball are neighbors in the ball grid array.

13. The system of claim 10, wherein the integrated circuit package further comprises a bridge electrically coupling a third contact ball with at least one of the first contact ball or the second contact ball.

14. The system of claim 10, wherein, in the integrated circuit package, the capacitor comprises a capacitor body disposed over an insulating layer on the first side of the substrate.

15. The system of claim 10, further comprising a memory circuit package mounted on the printed circuit board, the memory circuit package storing instructions or data for processing by the integrated circuit component of the integrated circuit package.

16. A system comprising:
a printed circuit board; and
an integrated circuit package mounted on the printed circuit board, wherein the integrated circuit package comprises:
a substrate having a first side and a second side opposite the first side;
an integrated circuit component coupled to the second side of the substrate;
a ball grid array formed on the first side of the substrate, the ball grid array comprising multiple contact balls arranged in a pattern, wherein each of a first subset of the contact balls is electrically coupled to a first voltage input of an integrated circuit component, and each of a second subset of the contact balls is electrically coupled to a second voltage input of the integrated circuit component;
a capacitor mounted to the first side and having a first terminal coupled to a first contact ball in the first subset of the contact balls and a second terminal coupled to a second contact ball in the second subset of the contact balls; and
a board capacitor mounted on the printed circuit board, the board capacitor having a drain voltage terminal coupled with a first power terminal providing a drain voltage to the integrated circuit component and a sink voltage terminal coupled with a second power terminal providing a sink voltage to the integrated circuit component.

17. A system comprising:
a printed circuit board; and
an integrated circuit package mounted on the printed circuit board, wherein the integrated circuit package comprises:
a substrate having a first side and a second side opposite the first side;
an integrated circuit component coupled to the second side of the substrate;
a ball grid array formed on the first side of the substrate, the ball grid array comprising multiple contact balls arranged in a pattern, wherein each of a first subset of the contact balls is electrically coupled to a first voltage input of an integrated circuit component, and each of a second subset of the contact balls is electrically coupled to a second voltage input of the integrated circuit component;
a capacitor mounted to the first side and having a first terminal coupled to a first contact ball in the first subset of the contact balls and a second terminal coupled to a second contact ball in the second subset of the contact balls; and
a first power terminal mounted on the printed circuit board and coupled to the first contact ball and a second power terminal mounted on the printed circuit board and coupled to the second contact ball.

18. A system comprising:
a printed circuit board; and
an integrated circuit package mounted on the printed circuit board, wherein the integrated circuit package comprises:
a substrate having a first side and a second side opposite the first side;
an integrated circuit component coupled to the second side of the substrate;
a ball grid array formed on the first side of the substrate, the ball grid array comprising multiple contact balls arranged in a pattern, wherein each of a first subset of the contact balls is electrically coupled to a first voltage input of an integrated circuit component, and each of a second subset of the contact balls is electrically coupled to a second voltage input of the integrated circuit component; and
a capacitor mounted to the first side and having a first terminal coupled to a first contact ball in the first subset of the contact balls and a second terminal coupled to a second contact ball in the second subset of the contact balls;
a memory circuit package mounted on the printed circuit board, the memory circuit package storing instructions or data for processing by the integrated circuit component of the integrated circuit package; and
a memory circuit package mounted on the printed circuit board, wherein the memory circuit package includes a second ball grid array at a bottom side, the second ball grid array comprising multiple contact balls, wherein the second ball grid array includes a second capacitor having a drain voltage terminal coupled with a drain voltage contact ball and a sink voltage terminal coupled with a sink voltage contact ball, and wherein the drain voltage contact ball and the sink voltage contact ball are selected from the second ball grid array.

* * * * *